United States Patent
Roberts et al.

(10) Patent No.: US 6,881,592 B2
(45) Date of Patent: Apr. 19, 2005

(54) METHOD AND DEVICE FOR MINIMIZING MULTI-LAYER MICROSCOPIC AND MACROSCOPIC ALIGNMENT ERRORS

(75) Inventors: William Roberts, Mechanicsville, VA (US); Diem-Thy Ngu-Uyen Tran, Richmond, VA (US); Paul Jowett, Richmond, VA (US); Nicholas Clements, Glen Allen, VA (US); Igor Jekauc, Richmond, VA (US); Karen Anne Davidson, Mechanicsville, VA (US); Winifried Sabisch, Munich (DE)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 10/453,858

(22) Filed: Jun. 3, 2003

(65) Prior Publication Data

US 2004/0072447 A1 Apr. 15, 2004

Related U.S. Application Data

(60) Provisional application No. 60/418,143, filed on Oct. 11, 2002.

(51) Int. Cl.$^7$ .............................................. H01L 21/66
(52) U.S. Cl. ............................ 438/8; 438/13; 438/18; 438/401
(58) Field of Search ............................ 438/5–11, 16–18, 438/401, 462, FOR 495

(56) References Cited

U.S. PATENT DOCUMENTS

2002/0142511 A1 * 10/2002 Okayama et al. ............. 438/80
2002/0180067 A1 * 12/2002 Hoshi et al. ................. 257/797
2002/0186359 A1 * 12/2002 Meisburger et al. .......... 355/69
2003/0211757 A1 * 11/2003 Gondhalekar et al. ....... 438/788

* cited by examiner

Primary Examiner—George Fourson
Assistant Examiner—Thanh V Pham
(74) Attorney, Agent, or Firm—Brinks Hofer Gilson & Lione

(57) ABSTRACT

A method of aligning a second layer to a first layer of a semiconductor structure by forming a first layer of a wafer having a distinguished feature via a first etching process that employs a first ionized gas generating machine. Forming a second layer having a circuit pattern via a second etching process that employs a second ionized gas generating machine, wherein the forming the second layer includes minimizing relative shifting between the distinguished feature located at an edge of the wafer for the first layer and the second circuit pattern located at the edge of the wafer for the second layer.

22 Claims, 17 Drawing Sheets

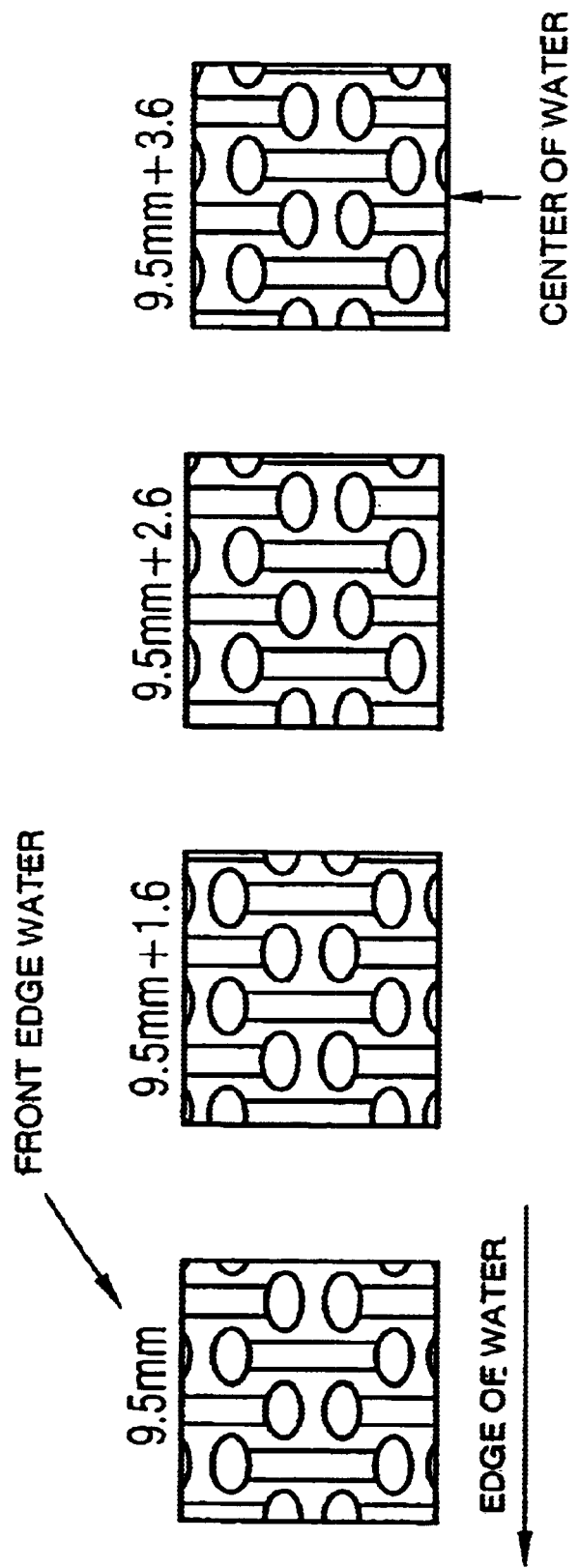

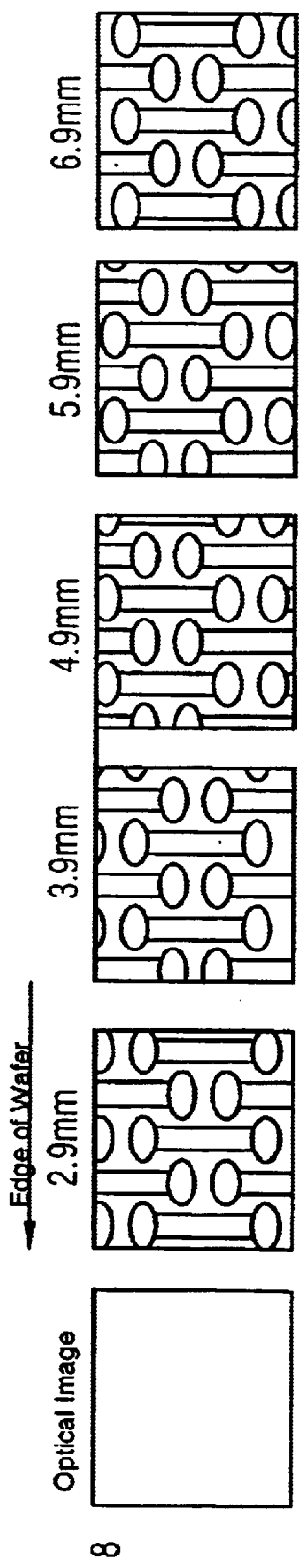
FIG 5A
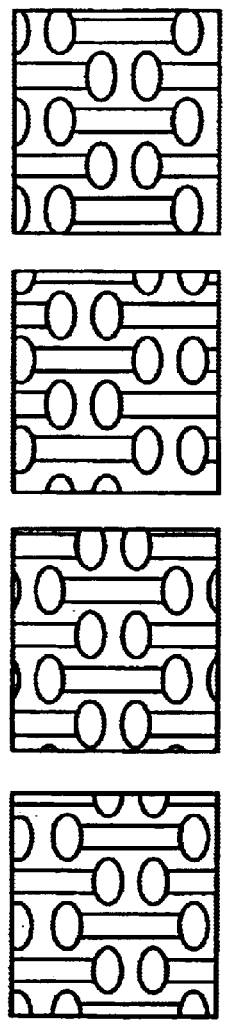
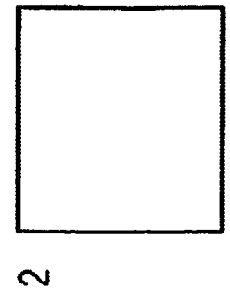
FIG 5B
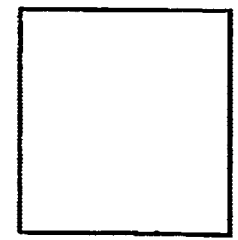
FIG 5C

Ø7.9590 ± .002
Ø7.7250 ± .002
3.8050 +.002/−.000

METHOD AND DEVICE FOR MINIMIZING MULTI-LAYER MICROSCOPIC AND MACROSCOPIC ALIGNMENT ERRORS

Applicants claim, under 35 U.S.C. § 119(e), the benefit of priority of the filing date of Oct. 11, 2002 of U.S. Provisional Patent Application Ser. No. 60/418,143 filed on the aforementioned date, the entire contents of which are incorporated herein by reference.

BACKGROUND OF THE INVENTION

1. Field of the Invention

The present invention relates to the field of processing multiple pattern layers.

2. Discussion of Related Art

It is well known in the art to process semiconductor wafers by building multiple layers of conductive patterns of circuitry upon one another. As a simple example, a typical process of building a two layer semiconductor structure would be to first form a deep trench pattern via a lithographic process. This is accomplished by first adding layers of semiconductor materials, such as silicon dioxide or silicon nitride, to a flat film wafer in a well known manner such as film deposition or growth. After the layers are formed, a so-called deep trench lithographic process is performed. The deep trench lithographic process involves applying a photoresist layer onto the semiconductor layer. The photoresist layer is then exposed to light or radiation. The light or radiation passes through a patterned reticle and has a particular wavelength so as to react with the photoresist layer. The reticle defines a desired deep trench circuit pattern so that the light or radiation exposes the first layer in a pattern similar to the desired deep trench circuit pattern. Note that in the past, it was only during the process of exposing a wafer at any given stage where steps to overcome registration errors of pattern product layers were considered. After the photoresist has been exposed, chemicals are applied to the resist so that the desired deep trench circuit pattern is revealed.

After the deep trench circuit is formed in the first layer and passes inspection for defects, an etching process is performed on the layer. The etching process involves placing the wafer on a support, such as an electrostatic chuck, positioned within an ionized gas generator, such as a plasma etch chamber. Next, the plasma etch chamber is turned on so as to generate a plasma from a gas, such as HBr. The resist pattern is then transferred to the wafer in a parallel two-fold manner: 1) the plasma gases chemically interact with the exposed substrate materials of the deep trench pattern and 2) charged ions formed in the plasma are directed onto the layer so as to physically remove material from the layer.

After subsequent processing, the substrates are then returned to the lithography area to produce the next patterned layer. An active area circuit pattern is formed via a second lithographic process and a second etching process similar to the lithographic and etching processes described above. In the second so-called active area lithographic process a photoresist layer is applied as the second semiconductor pattern. The photoresist layer is exposed to light or radiation that passes through a reticle that has a pattern for forming a desired active area pattern on the second semiconductor layer. The light or radiation exposes the second layer in a pattern similar to the desired active area circuit pattern. After the photoresist has been exposed, chemicals are applied to the resist so that the desired active area circuit pattern is revealed.

Next, the wafer is placed in a second ionizing gas generator, such as a second plasma etch chamber, where the second layer undergoes an active area etch process. In this etch process, the wafer is placed within the second plasma etch chamber that processes the top layers. The active area circuit pattern is etched by the second plasma etch chamber in a manner similar to the etch process performed on the first layer. The second layer is cleaned and inspected in a manner similar to that done for the first layer.

Note that the above process continues until all layers are formed. Furthermore, the lithographic and etch processes may need to be altered from layer to layer in order to form the desired pattern in the substrate. Such altering can include using variations in plasma etch chamber design or process that is different than that used for the other layer.

FIG. 1 shows two layers formed by processes similar to those described above. As shown in FIG. 1, the active area circuits 100 have end portions 102, 104 that preferably extend in the Y-direction so that they overlap corresponding trench circuits 106, 108, respectively. The end portions 102, 104 are also preferably positioned so as to be centered on the corresponding trench circuits 106, 108. Should the end portions 102, 104 not be aligned with the centers of the corresponding circuits 106, 108, the semiconductor structure may result in unacceptable electrical performance.

Applicants have found that such misalignment can occur when one type of machine or etch chamber design and/or etching process is used during the etching step performed on the first layer while a second and different type of machine or etch chamber design and/or etching process is used during the etching step performed on the second layer. Without being confined to any one particular theory, it is believed that such misalignment can occur due to the machines/chambers used in the two etch process have differing cathode/anode ratios and/or structural geometries from one another. Such differences result in electric forces varying in both magnitude and direction near the surface of a wafer in one machine as compared to the distribution of electric forces near the wafer surface in the other machine. These differences are characterized and henceforth referred unto in terms of electric fields represented by electric field lines and in terms of derived equipotential/isopotential surfaces represented by isopotential lines. The differing of the shapes of the electric field lines/electrical isopotential surfaces results in different trajectories of ions impinging at the wafer surface for the two machines/chambers for a particular area of the wafer. The different trajectories cause a shift in the circuitry formed between subsequent layers of the wafer.

Note that there are other possible factors that can contribute to misalignment. For example, misalignment can be caused by differing electrostatic chuck designs, process parameters and/or process kits used in the two machines/chambers. In addition, the electric potential/electric fields/electric forces formed by a plasma can be thought of as having a global component due to the shape of the sheath and presheath of the plasma and a local component that depends on the shape of the electrical isopotential surfaces in the immediate neighborhood of the wafer edge. Thus, any factors that lead to differences in the sheaths and/or the presheaths of the two plasmas formed in the two chambers can lead to misalignment as well. In the case of the global component changes between the plasmas used, the plasma etch chamber geometries and/or focus ring geometries can lead to differences in the shape of the electrical isopotential surfaces. Regarding the local component associated with the shapes of the electrical isopotential surfaces near the edge of the wafer, different independent electric potential sources and differences in the edges can also lead to changes in the shapes of the electrical isopotential surface surfaces. Thus, in the case where both machines/chambers are similar structurally, misalignment can result when one or more parameters for the two etching processes differ from each other.

A schematic example of a plasma etch chamber 200 having a chamber 201 with a wall 203 is shown in FIG. 2. FIG. 2 illustrates principles that are common to differing plasma etch chambers used to etch consecutive layers of the wafer. In such plasma etch chambers, the ionized gas 202 encounters forces represented by the electric field lines 204 which are oriented perpendicular to the electrical isopotential lines 206. The ionized gas 202 is then steered via electric forces in the direction of the electric field lines 204 onto the wafer 208 that is held in place by an electrostatic chuck 210.

It is believed that the total electrical potential differences and thus the total electric field encountered by the ions at any point within the chamber can be thought of as the sum of two components: a global electrical force and a local electrical force as mentioned previously. As shown in FIG. 2, the tilt angle of the trajectory of the ions striking the top layer of wafer 208 with respect to the vertical varies with the distance from the side edge in a nonuniform manner, especially near the edge of the wafer, due to the combined effect of the global and local potentials. This nonuniform tilting results in the nonuniform etching pattern shown at the bottom of FIG. 2.

FIG. 2 represents general principles of either the first or second plasma etch chamber. As shown in FIG. 2, the electric field 204 is fairly uniform or linearly varies as viewed from the center axis 212 of the wafer and extending radially outward to a radial distance d from the center axis 212. The area of the wafer extending from center axis 212 to a radius d shall be deemed as the "central area 214." Within the central area 214, the tilt angle of the trajectory is small and is either constant or becomes larger away from a point near the center axis 212 in an approximately linear manner. The variation of the tilt angle results in a pattern shift $\delta(r)$ of the etched pattern relative to an ideal position of the etched pattern for the particular etch chamber. Like the tilt angle, the pattern shift $\delta(r)$ is either constant or becomes larger away from a point near the center axis 212 in an approximately linear manner.

As mentioned previously, the tilt angle of the trajectory at any point of the wafer within the center area 214 will probably vary between two consecutive layers that are etched by two differing machines/processes as shown in FIG. 3. Since the tilt angle of the ion trajectory varies this means that the shapes of the electrical isopotential surfaces and electric field strength and distribution at any point across the chamber for a given layer differ from the shapes of the electrical isopotential surfaces and electric field strength and distribution at any given point across the chamber for another layer. One consequence of such a difference between the shapes of the electrical isopotential surfaces and electric field lines in consecutive layers in the central area 214 is that the circuitry formed in the consecutive layers are shifted relative to one another. This is shown in FIG. 4 where the end portions 102, 104 of each of the active area circuits 100 within the central area 214 for one layer are shifted uniformly from the corresponding centers of the deep trench circuits 106, 108 formed in an adjacent overlying layer by an imaging shift factor $\Delta(r)$ that is the result of the difference of the two pattern shifts $\delta(r)$ associated with the two etching machines/processes used. The imaging shift factor is either a constant within central area 214 or is approximately a linear function that varies depending on the x and y coordinates within the central area 214. In addition, the imaging shift factor $\Delta(r)$ is nearly radially symmetrical about the center axis 212.

As shown in FIG. 2, outside the central area 214 the shapes of the electrical isopotential surfaces and electric field lines at the peripheral area 216 of the wafer are not uniform and cannot be described as a linear phenomenon. As shown in FIG. 2, the tilt angle of the trajectory of the ions of the ionized gas initially increases moving away from the central axis 212 and then decreases going further away from the central axis 212. FIGS. 4–7 show the shift of the end portions 102, 104 with respect to the corresponding centers of the deep trench circuits 106, 108 with the peripheral area 216.

As mentioned previously, the above described uniform shifting is the result of using different plasma etch chambers and/or processes during the etching of consecutive layers of the wafer. When two identical plasma etch chambers and etch processes are used on consecutive layers of the wafer, then the ions of the ionized gas are directed equally or in the same manner onto each layer and so no net misalignment between the adjacent overlying layers occurs. Unfortunately, it is often necessary to use different plasma etch chambers and/or etching processes for different layers being formed. Thus, misalignment can occur between adjacent layers.

It is therefore an object of the present invention to correct the alignment between the circuitry of consecutive layers of a semiconductor structure.

Other objects of the present invention include improving device performance and device yields.

SUMMARY OF THE INVENTION

One aspect of the present invention regards a method of aligning a second layer to a first layer of a semiconductor structure by forming a first layer having a distinguished feature via a first etching process that employs a first ionized gas generating machine that has a first pattern shift. Forming a second layer having a circuit pattern via a second etching process that employs a second ionized gas generating machine that has a second pattern shift, wherein the second etching process compensates for an image displacement factor that is a difference between the second pattern shift and the first pattern shift.

A second aspect of the present invention regards a method of aligning a second layer to a first layer of a semiconductor structure by forming a first layer of a wafer having a distinguished feature via a first etching process that employs a first ionized gas generating machine. Forming a second layer having a circuit pattern via a second etching process that employs a second ionized gas generating machine, wherein the formation of the second layer includes minimizing relative shifting between the distinguished feature located at an edge of the wafer and the circuit pattern located at the edge of the wafer.

A third aspect of the present invention regards an ionized gas generator that includes a focusing correction device positioned within an interior space adjacent to an edge of a support. The focusing correction device includes a first annular-like piece positioned adjacent to the support, the first annular-like piece having a resistivity of approximately 0.02Ω-cm, an inner upper side inclined outward with respect to a center of the wafer by approximately 10°, an outer side having a height of approximately 0.2044 inches, and an inner lower side having a height of approximately 0.142 inches, and a width that ranges from approximately 3 mm to 30 mm. The focusing correction device also includes a piece of quartz positioned adjacent to the first annular-like piece and the support and a second annular-like piece positioned above the piece of quartz, the second annular-like piece having a side cross-sectional shape of a trapezoid. The ionized gas generator further includes a housing defining the interior space, a source of ionized gas positioned within the interior space and a wafer supported on the support and contained within the interior space and positioned so as to receive ions from the source. The focusing correction device minimizes shifting between a distinguished feature of a layer of the wafer and a portion of a circuit pattern of another layer of the wafer located at the edge of the wafer.

A fourth aspect of the present invention regards an ionized gas generating machine that includes a housing defining an interior space and a source of ionized gas positioned within the interior space. A wafer is contained within the interior space and positioned so as to receive ions from the source. A focusing correction device is positioned within the interior space adjacent to an edge of the wafer, wherein the focusing correction device minimizes shifting between a distinguished feature of a layer of the wafer and a circuit pattern of another layer of the wafer located at the edge of the wafer.

A fifth aspect of the present invention regards an ionized gas generator that includes a focusing correction device positioned within an interior space adjacent to an edge of a support. The focusing correction device includes an annular-like piece positioned adjacent to the support, the annular-like piece having a resistivity ranging from approximately 0.01Ω-cm to 0.05Ω-cm, a first interior surface that extends from the support, a second interior surface connected to the first interior surface and inclined outward with respect to a center of the support by a first angle, a third interior surface connected to the second interior surface and inclined outward with respect to the center of the support by a second angle. The focusing correction device further includes a piece of quartz positioned adjacent to the annular-like piece and the support. The ionized gas generator also includes a housing defining the interior space, a source of ionized gas positioned within the interior space and a wafer supported on the support and contained within the interior space and positioned so as to receive ions from the source. The focusing correction device minimizes shifting between a distinguished feature of a layer of the wafer and a portion of a circuit pattern of another layer of the wafer located at the edge of the wafer.

Each aspect of the present invention provides the advantage of correcting the alignment between the circuitry of consecutive layers of a semiconductor structure.

Each aspect of the present invention provides the advantage of improving device performance.

Each aspect of the present invention provides the advantage of improving device yields.

The present invention, together with attendant objects and advantages, will be best understood with reference to the detailed description below in connection with the attached drawings.

DESCRIPTION OF THE DRAWINGS

FIG. 4 shows alignment between subsequent layers at various radial positions across a wafer;

FIGS. 5(a)–(c) show alignment between subsequent layers at various positions near the edge of a wafer at the 8 o'clock, 2 o'clock and 4 o'clock positions of the wafer, respectively;

DETAILED DESCRIPTION OF THE INVENTION

As previously mentioned, Applicants have discovered that misalignment can occur between the electrical circuits and/or components formed on adjacent layers of a semiconductor structure during etching. To counteract this misalignment, Applicants have devised a method and devices for counteracting the misalignment as will be described below.

Figure 1:
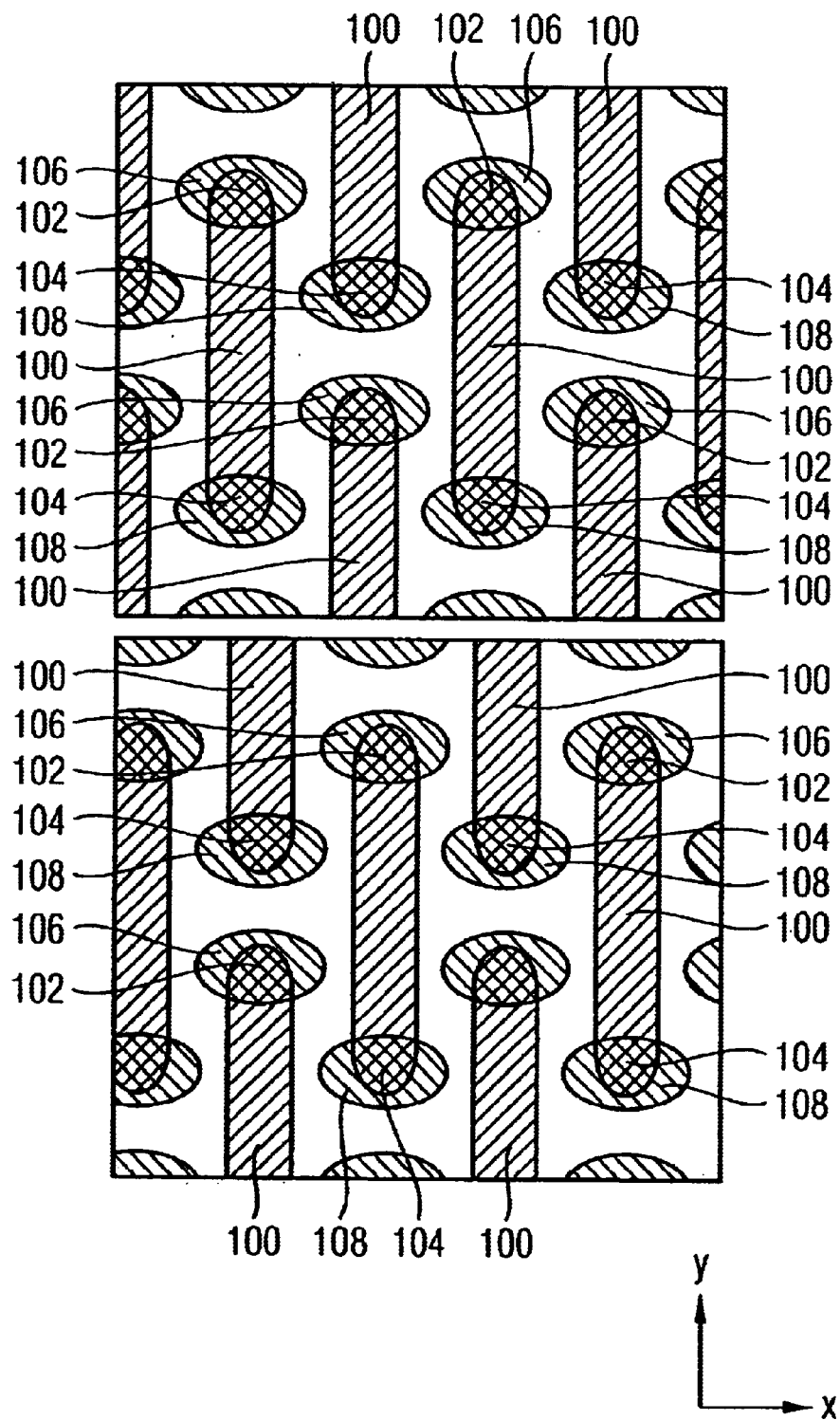
FIG. 1 schematically shows an image of a desired alignment between tow overlying layers containing etched circuit patterns.
Figure 2:
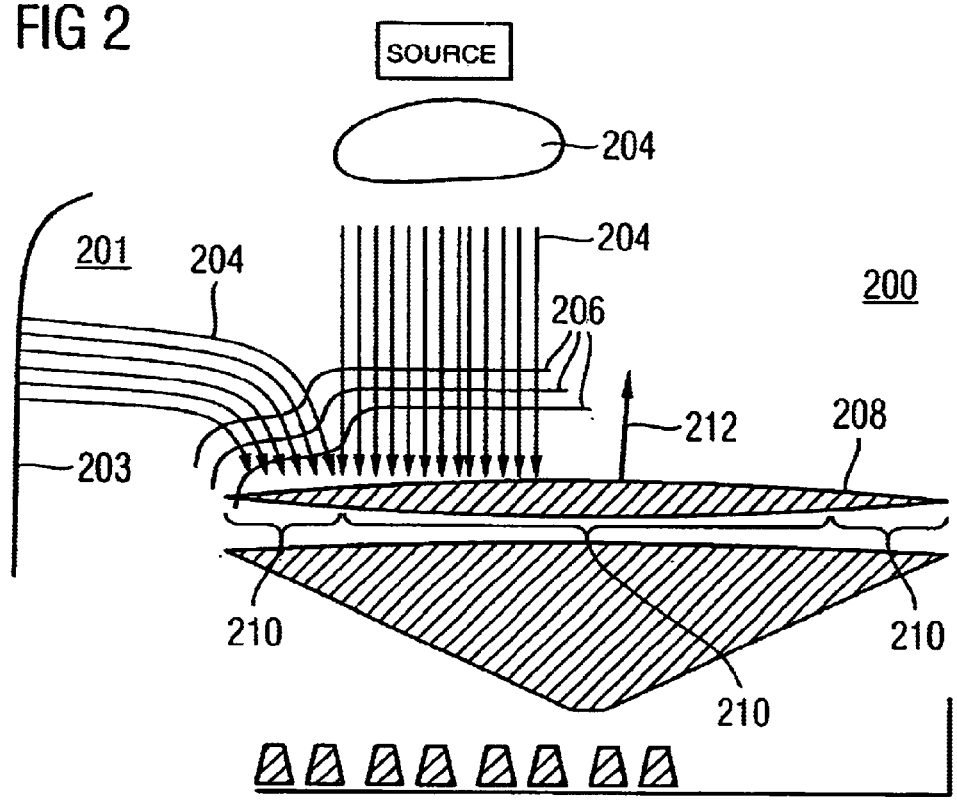
FIG. 2 schematically shows an ionized gas generating machine that generates radiation that is tilted at a wafer.
Figure 3:
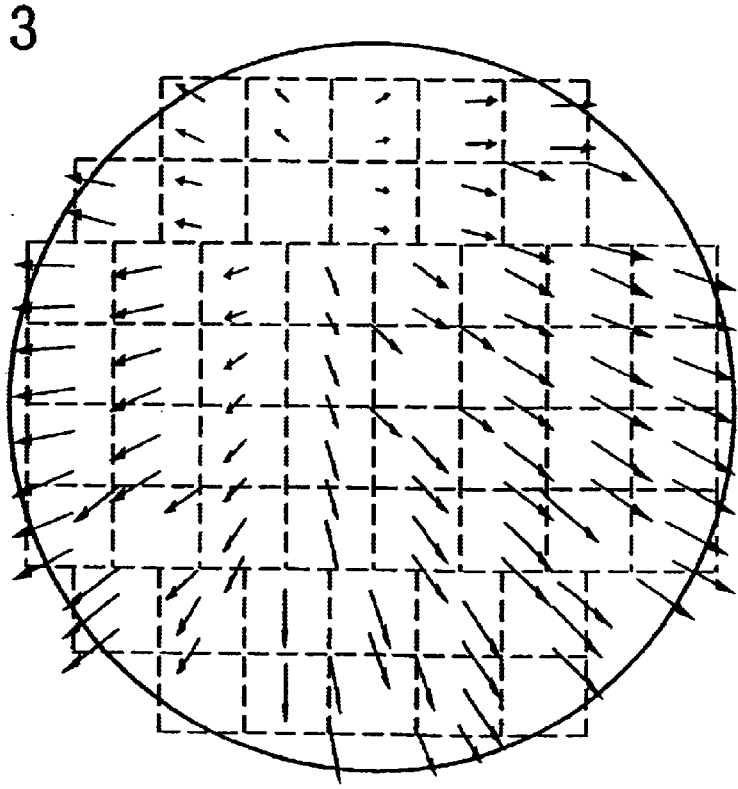
FIG. 3 shows a plot of pattern displacement between overlying layers of a wafer.
Figure 6:
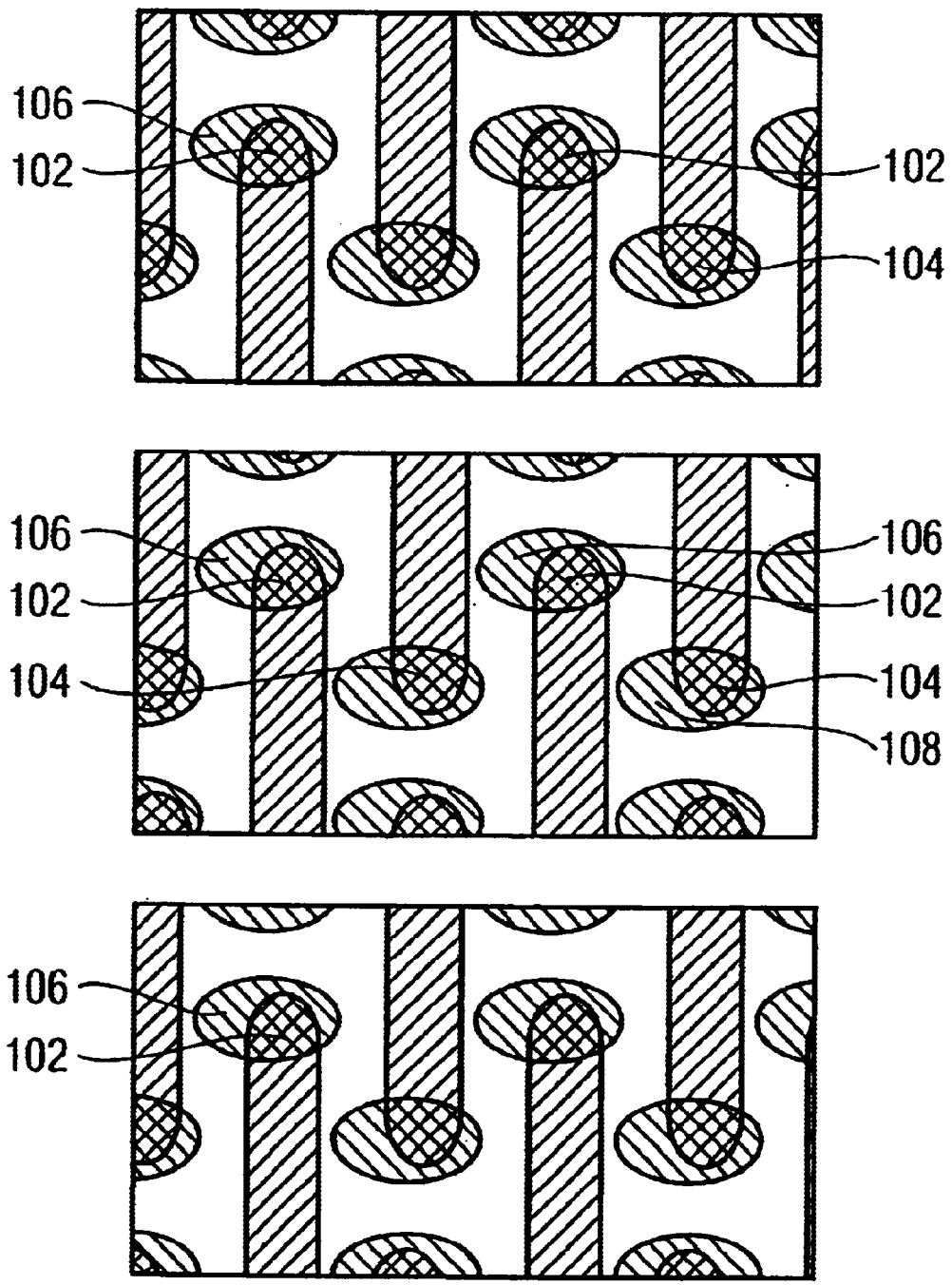
FIGS. 6 and 7 show misalignment of two overlying layers containing etched circuit patterns at an edge of a wafer.
Figure 7:
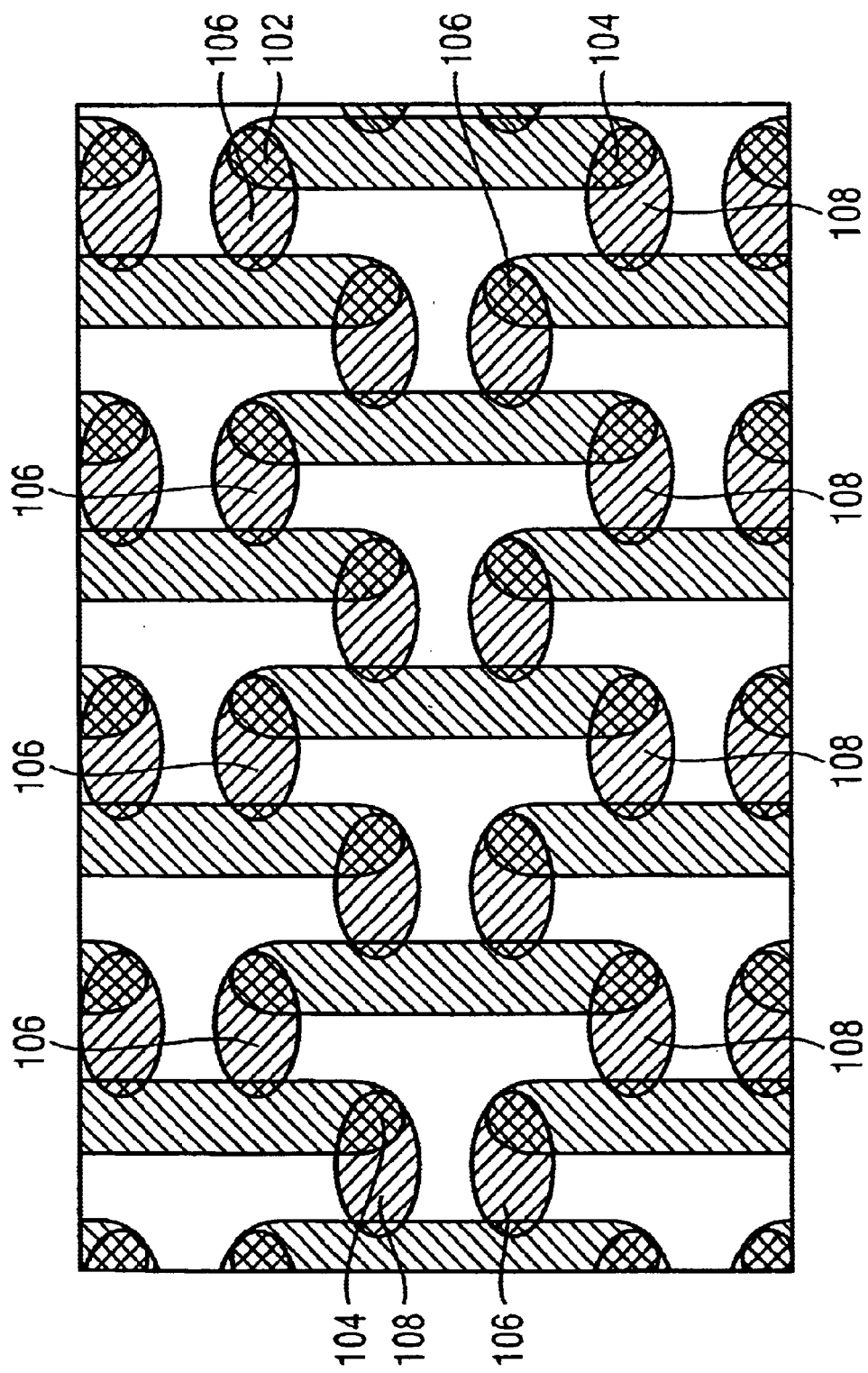
Figure 8:
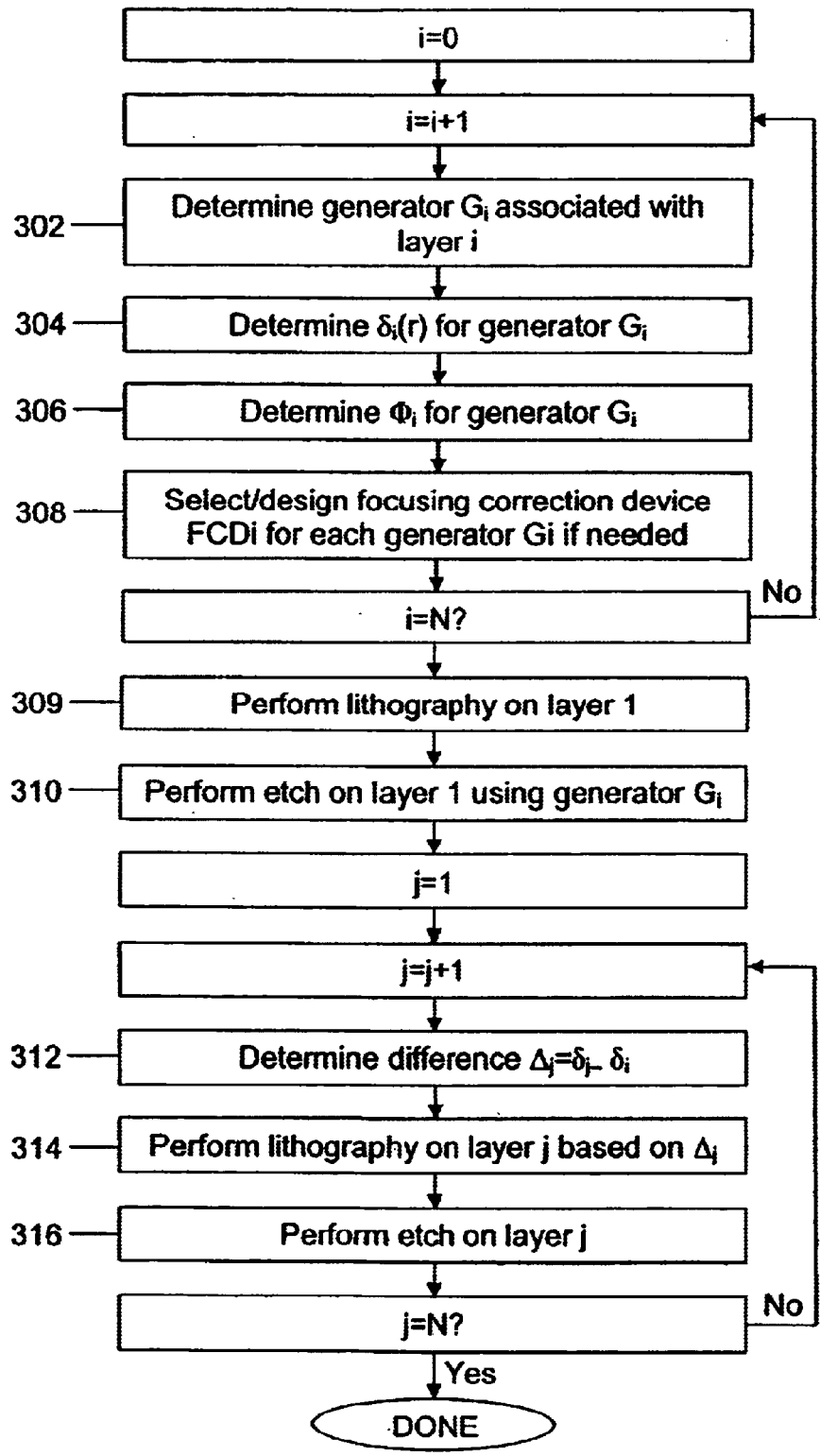
FIG. 8 shows a flows chart that illustrates an embodiment of a method of aligning circuit patterns formed on consecutive layers of a wafer in accordance with the present invention.

As shown in FIG. 8, the first step in the alignment process 300 according to the present invention is to identify each plasma etch chamber $G_i$ (i=1, . . . N) that is to be used to during the etching processes performed for each of the N total layers of a semiconductor structure and to determine the order of their use per step 302. After the plasma etch chambers have been identified per step 302, then a pattern shift $\delta_i(r)$ is determined for each plasma etch chamber $G_i$ per step 304. As mentioned previously, the pattern shift $\delta_i(r)$ is either constant or linear within the central area 212 that extends from the center axis 210 to a radius d that has a value that is dependent on such factors as the design of the plasma etch chamber, the design of the process kit and/or the parameters of the etch process. The determining of the pattern shift $\delta_i(r)$ per step 304 can be performed by the manufacturer of the plasma etch chamber of interest or by performing experiments on the plasma etch chamber of interest after it has been shipped by the manufacturer. The determining can use actual wafers, test wafers or use simulations to determine the shift factor.

Besides determining the pattern shift $\delta_i(r)$ for each plasma etch chamber $G_i$, the shapes of the electrical isopotential surfaces $\Phi_i$ and/or electric fields associated with each plasma etch chamber are determined outside the central area from the radius d to the edge of the wafer per step 306. This determination can be performed through experimentation when an actual product or a test sample is placed within the chamber and exposed to ionized gas. Simulation models can be generated as well without the need for using wafers.

Upon determining the shapes of the electrical isopotential surfaces and/or the electric field distribution for a particular plasma etch chamber and wafer configuration within the chamber, a focusing correction device ($FCD_i$) is selected/designed and mounted within the particular plasma etch chamber $G_i$ near where the wafer will reside within the chamber per step 308. The focusing correction device $FCD_i$ has a structure such that the shapes of the electrical isopotential surfaces are made to be substantially the same as the shapes of the electrical isopotential surfaces present during the etching of the previously formed layer and so the shift between product features of consecutive layers will be minimized.

Figure 9:
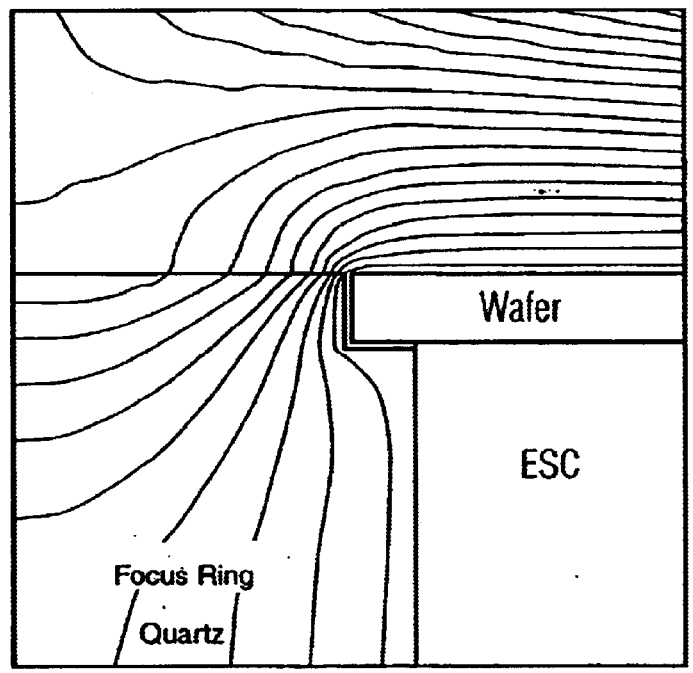
FIG. 9 shows results of a simulation of the shapes of electrical isopotential surfaces present at a portion of a wafer when a first embodiment of a material is placed adjacent to the wafer.
Figure 10:
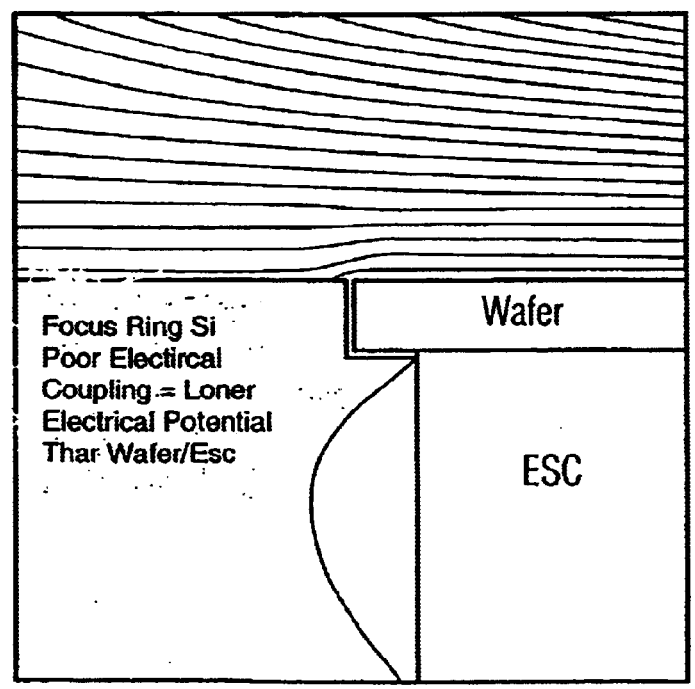
FIG. 10 shows results of a simulation of the shapes of electrical isopotential surfaces present at a portion of a wafer when a second embodiment of a material is placed adjacent to the wafer.
Figure 11:
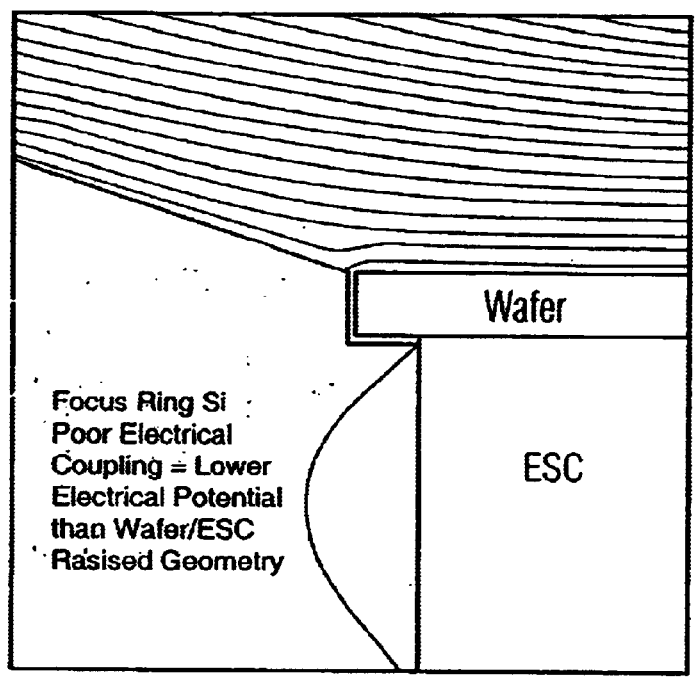
FIG. 11 shows results of a simulation of the shapes of the electrical isopotential surfaces present at a portion of a wafer when a third embodiment of a material with poor coupling is placed adjacent to the wafer.
Figure 12:
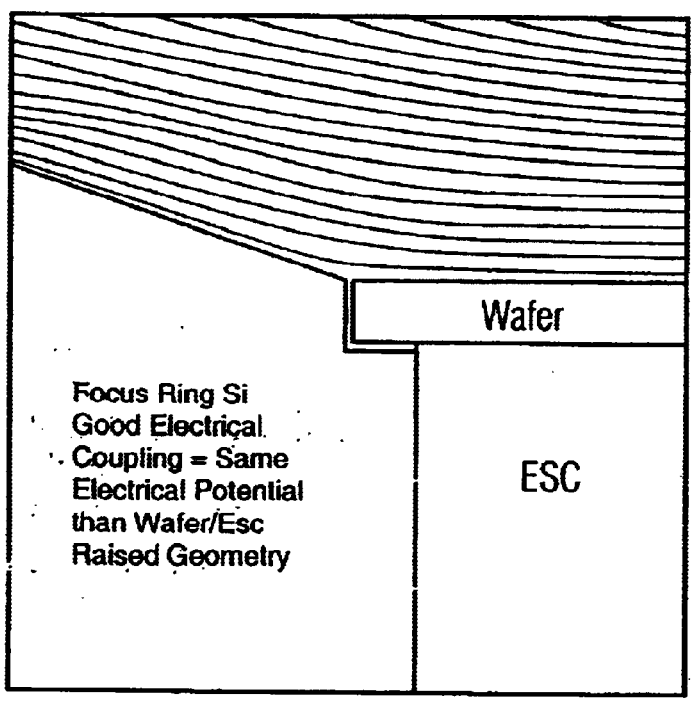
FIG. 12 shows results of a simulation of the shapes of electrical isopotential surfaces present at a portion of a wafer when a fourth embodiment of a material with good coupling is placed adjacent to the wafer.

In designing the focusing correction device, it should be kept in mind that there are a variety of ways to alter the shapes of the electrical isopotential surfaces near the edges of the wafer. For example, the electric potential difference can be altered by applying an added electrical force from an independent source and/or by placing one or more geometrical inserts near the edges of the wafer. FIG. 9 shows the effect on the shapes of the electrical isopotential surfaces when an annular focus ring made of quartz is placed near the edges of the wafer. FIG. 10 shows the shape of the electrical isopotential surfaces caused by an annular focus ring made of silicon that is at a potential lower than that of the wafer and the electrostatic chuck. FIGS. 11 and 12 show the shape of the electrical isopotential surfaces when a differently shaped annular focus ring made of silicon has a potential that is either lower than that of the wafer and electrostatic chuck (FIG. 11) or the same potential as the wafer and electrostatic chuck (FIG. 12). By varying the shape and/or potentials of the focusing correction device, the resultant shapes of the electrical isopotential surfaces can be altered to be nearly the same as that formed with the previously etched layer.

Once the last focusing correction device $FCD_N$ is selected/designed for the plasma etch chamber $G_N$ per step 308, the etching processes for the various N layers of the semiconductor structure are performed sequentially using the appropriate plasma etch chambers identified per step 302 so as to form electrical patterns on the various layers. As shown in FIG. 8, the first layer i=1 is formed by performing lithography per step 309 and an etching process with the plasma etch chamber $G_I$ per step 310. Next, the pattern shift $\delta_j(r)$ corresponding with the plasma etch chamber $G_j$ used for the jth layer is compared with the pattern shift $\delta_1(r)$ for the first layer and an image displacement factor $\Delta_j = \delta_j(r) - \delta_1(r)$ between the two is determined per step 312. This image displacement factor is applied during the lithography process performed on the jth layer per step 314 so that there is no displacement between the jth layer and the first layer within the central area 214 after the etching process is performed on the jth layer by plasma etch chamber $G_j$ per step 316. Such a process will ensure that there will be no displacement between the jth layer and the j−1$^{th}$ layer. Note that a well known compensation process is performed in the lithography process so as to shift the circuitry in the layer so as to be properly aligned. This process is continued until all N total layers of the semiconductor structure are formed.

Note that other variations of the process described above with respect to FIG. 8 are possible. For example, step 304's determining the pattern shift δ for each generator can be replaced by determining the image displacement factor Δ generated by any two plasma etch chambers used to form two consecutive layers. Such an image displacement factor can be determined by the user or manufacturer. The image displacement factor determined in this case is then used to control the lithography process for the latter formed layer in a manner similar to step 314.

Examples of various focusing correction devices determined in step 308 to be used with a plasma etch chamber, such as the device known by the trade name of Super-e made by Applied Materials, are discussed below with respect to FIGS. 13–26. In particular, a first embodiment of a possible focusing correction device is shown in FIGS. 13–16. The focusing correction device 400 includes a focusing collar made of an annular-like focus ring made of single crystal p-type silicon 402, having a resistivity of 0.02Ω-cm, that is placed next to the electrostatic chuck 210 and below and adjacent the wafer 208. A quartz piece 404 is placed adjacent to and below the silicon piece 402. A separate silicon piece 405 is placed directly on top of the quartz piece 404. The silicon piece 405 has a trapezoidal shape having a height H that can have a range of values and an angle α that can have a range of values as well that are determined so as to correct the shapes of the electrical isopotential surfaces and electric field to be as equivalent as possible as those of the adjacent layer.

Figure 13:
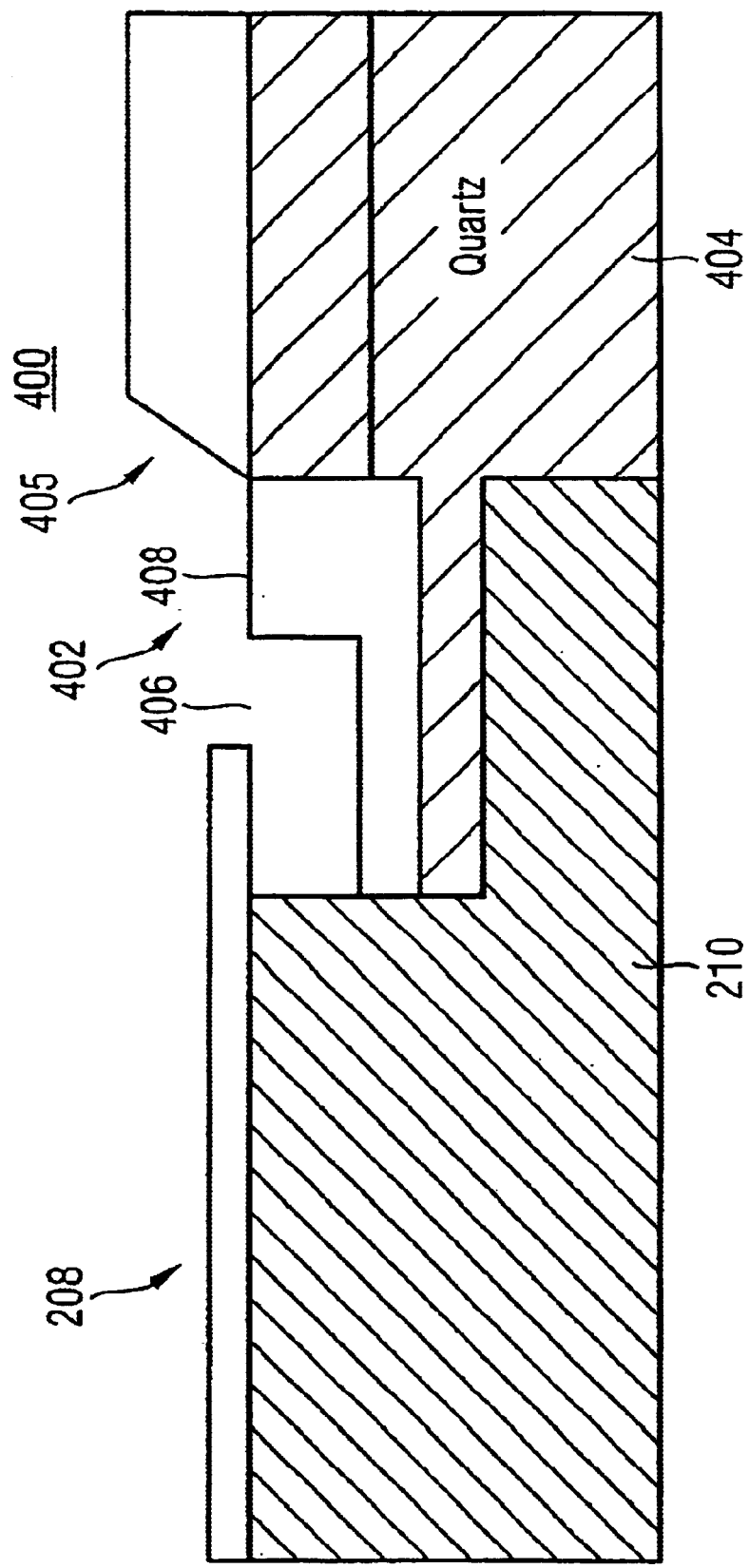
FIG. 13 shows a cross-sectional view of an embodiment of a focusing correction device to be used in conjunction with an ionized gas generating machine in accordance with the present invention.
Figure 14:
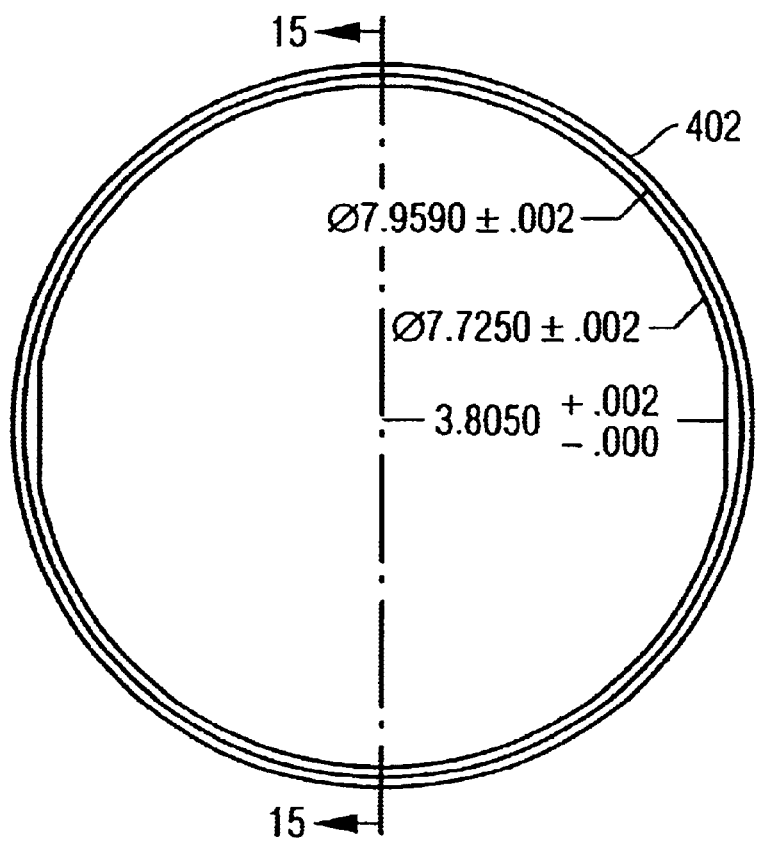
FIG. 14 shows a top view of an embodiment of a focusing collar to be used with the focusing correction device of FIG. 13.
Figure 15:
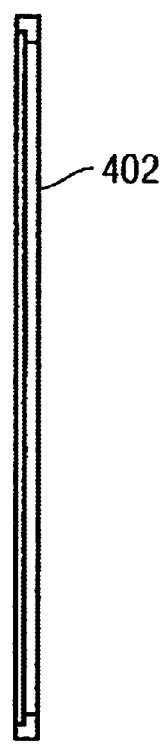
FIG. 15 shows a cross-sectional view of the focusing collar of FIG. 14 taken along lines 15—15 of FIG. 14.
Figure 16:
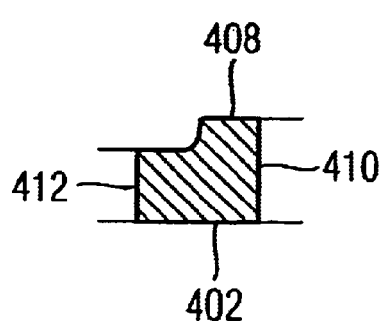
FIG. 16 shows an enlarged side cross-sectional view of the focusing collar of FIG. 14.

As shown in FIGS. 13 and 16, the silicon piece 402 has such a shape so that an annular gap 406 is formed between the top portion 408 of the silicon piece 402 and the wafer 208. As shown in FIGS. 13 and 16, the outer side 410 of the silicon piece 402 has a height of approximately 0.2044 inches and the inner lower side 412 has a height of approximately 0.142 inches. The bottom surface 414 has a width that ranges from approximately 3 mm to 30 mm and the inner upper side is inclined outward by an angle of approximately 10° with respect to vertical.

The silicon piece 402, the quartz piece 404 and the second silicon piece 405 are annular-like in that they circumscribe the wafer 208. The silicon piece 402 has a radius of approximately 3.8050 inches. The silicon piece 402 has a good coupling with the wafer and the electrostatic chuck and the second piece 405 can have either a good or poor coupling with the wafer and the electrostatic chuck.

Figure 17:
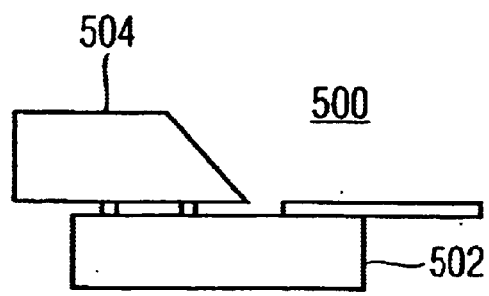
FIG. 17 shows a second embodiment of a focusing correction device in accordance with the present invention.

A second embodiment of a possible focusing correction device is shown in FIG. 17. The focusing correction device 500 includes a power coupled annular-like piece of silicon 502. In addition, a silicon piece 504 is supported above the top surface of the silicon piece 502, via one or more quartz supports 506, by an amount that ranges from approximately 0.1 mm to 5 mm. In addition, the silicon piece 504 is insulated from silicon piece 502. The silicon piece 504 has a side cross-sectional shape of a trapezoid with a height H that can have a range of values and an angle α that can have a range of values as well that are determined so as to correct the shapes of the electrical isopotential surfaces and electric fields to be the same as that of the adjacent layer. An annular gap 508 is formed between the silicon piece 504 and the wafer 208. The silicon piece 502 has a good coupling with the wafer and the electrostatic chuck while the silicon piece 504 has a poor coupling.

A third embodiment of a possible focusing correction device is schematically shown in FIGS. 18–25. The focusing correction device 600 includes a focusing collar made of an annular-like focus ring made of single crystal p-type silicon 602, having a low resistivity ranging from 0.01Ω-cm to 0.05Ω-cm, that is placed next to the electrostatic chuck 603 and below and adjacent the wafer 208.

Figure 18:
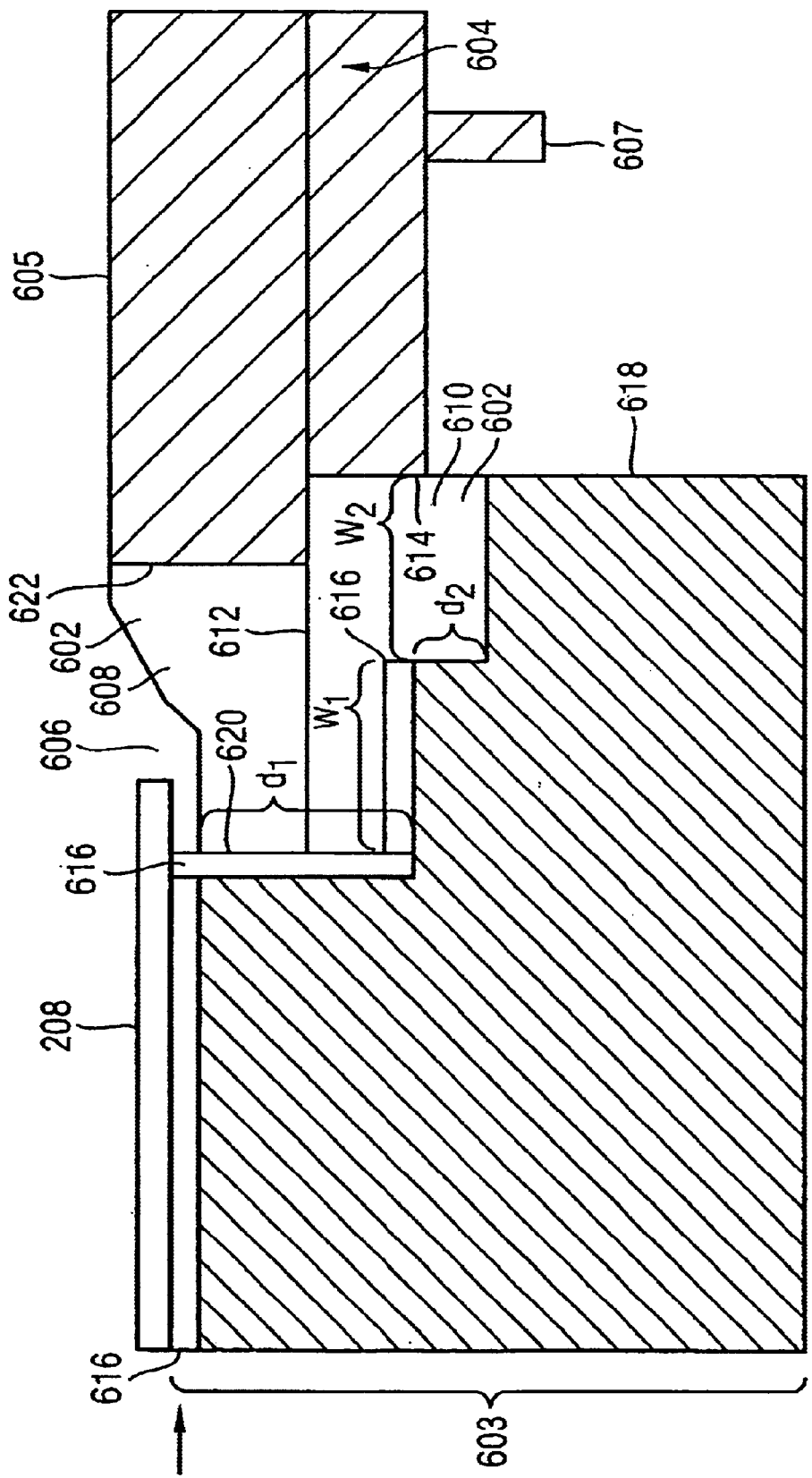
FIG. 18 shows a third embodiment of a focusing correction device in accordance with the present invention.

As shown in FIG. 18, the perimeter of the cylindrical-like ceramic electrostatic chuck 603 has a two-step profile. The first step has a depth d1 and a width w1. The second lower step has a shallower depth d2 and a width w2 of approximately 0.545 inches. A dielectric layer 616 made of a ceramic material that covers the top of the electrostatic chuck 603 and the first step. The dielectric layer 616 functions in a manner well known in the art. The wafer 208 is placed on top of the layer 616 as shown in FIG. 18.

Figure 19:
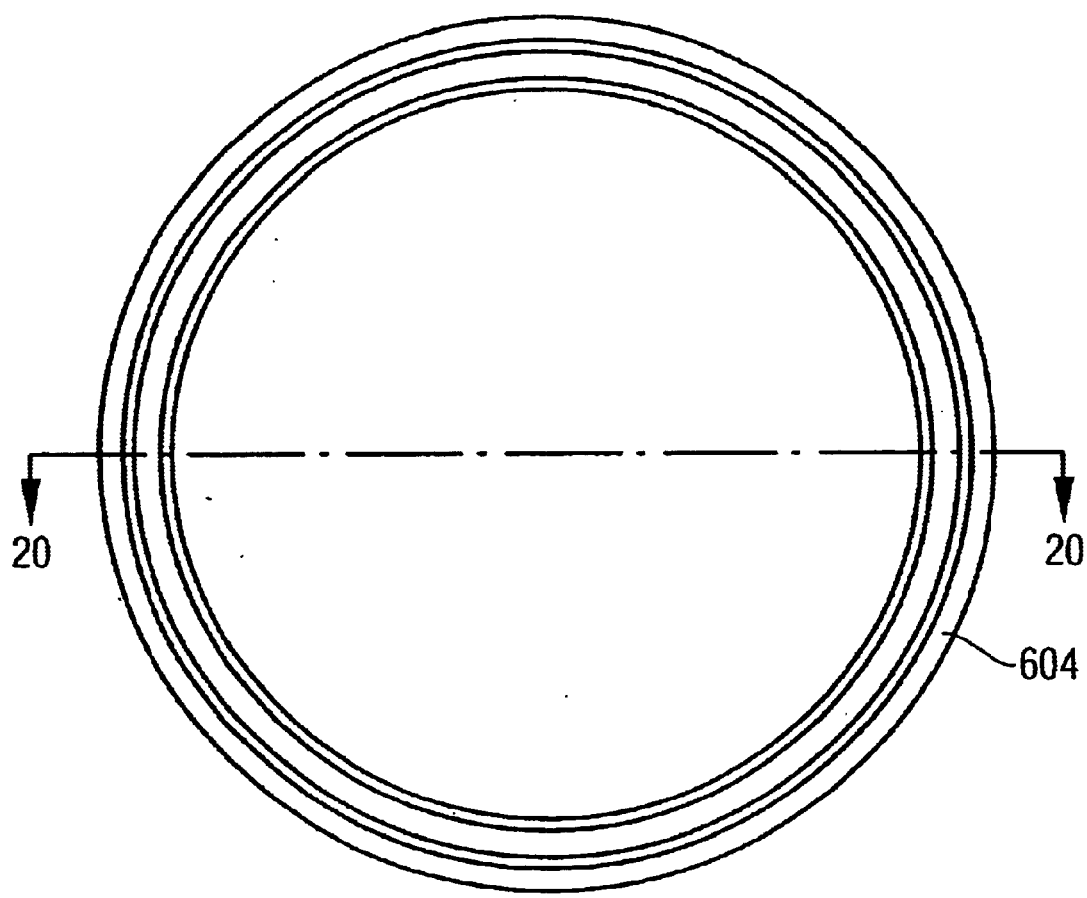
FIG. 19 shows a bottom view of an embodiment of a quartz piece used with the focusing correction device of FIG. 18 in accordance with the present invention.
Figure 20:
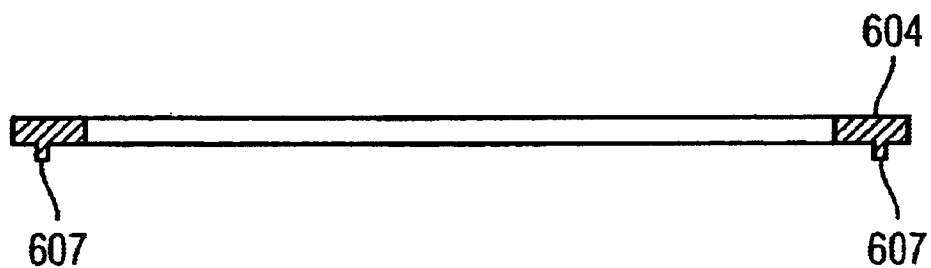
FIG. 20 shows a side cross-sectional view of the quartz piece of FIG. 19 taken along line 20—20 of FIG. 19.

A quartz material 650 is spaced from the electrostatic chuck 603 and acts as an insulator between the cathode and anode. As shown by the horizontal lines in FIG. 18, the quartz material 650 can be thought of has having three pieces integral with one another. For example, an annular-like quartz piece 604 is placed above and near to the second step of the chuck 603. A second annular quartz piece 605 is positioned directly on top of the quartz piece 604. As shown in FIGS. 19 and 20, the piece 604 has an inner diameter of approximately 8.91 inches, a height of approximately 0.325 inches and a width of approximately 0.815 inches, wherein the inner face is approximately 0.245 inches above the second step and is aligned with the outer edge of the electrostatic chuck 603. The piece 604 is integrally attached to a lower annular appendage 607 that has an inner diameter of approximately 9.831 inches, height of approximately 0.495 inches and width of approximately 0.125 inches. The appendage 607 is inserted in a slot (not shown) so as to improve the alignment of the quartz material 650.

The top annular piece 605 has an inner diameter of approximately 8.90 inches, a height of approximately 0.285 inches and a width of approximately 1.049 inches.

As shown in FIG. 18, the gap formed between the electrostatic chuck 603 and the quartz pieces 604 and 605 is substantially filled with a silicon intermediate material 602. The material 602 has such a shape so that a gap 606 is formed between the material 602 and the wafer 208. As shown in FIG. 18, the material 602 includes a top silicon piece 608 positioned upon a bottom piece 610. While the silicon pieces 608 and 610 are preferably separate from one another, they can be formed as a single piece as well.

Figure 21:
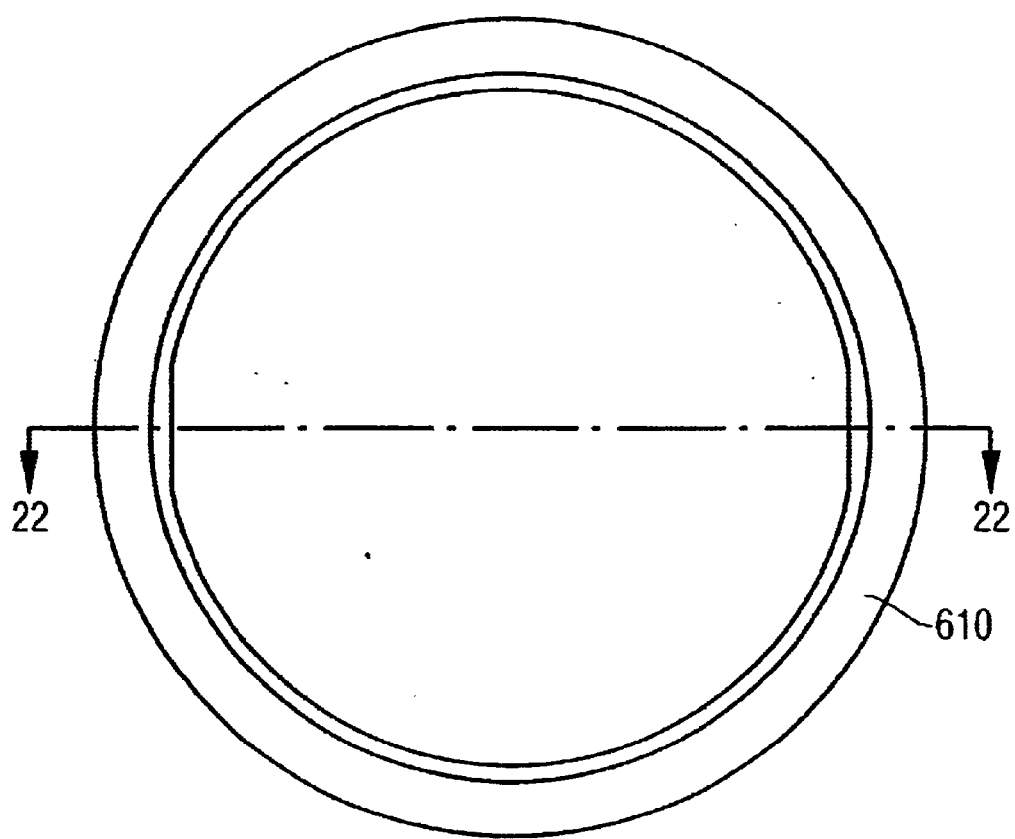
FIG. 21 shows a bottom view of an embodiment of a bottom silicon piece used with the focusing correction device of FIG. 18 in accordance with the present invention.
Figure 22:
FIG. 22 shows a side cross-sectional view of the bottom silicon piece of FIG. 21 taken along line 22—22 of FIG. 21.

As shown in FIG. 18, the bottom piece 610 is supported upon the bottom two steps of the electrostatic chuck 603. The bottom piece 610 has a top face 612 that is parallel with the top face of the quartz piece 604, and has an outer face 614 that abuts an inner face of the quartz piece 604 and is aligned with a lower, outer face 618 of the electrostatic chuck 603. As shown in FIGS. 21 and 22, the silicon bottom piece 610 has a minimum inner diameter of approximately 7.725 inches and a maximum inner diameter of approximately 8.010 inches. The bottom piece 610 has total width of approximately 0.687 inches and has a maximum height of approximately 0.285 inches.

Figure 23:
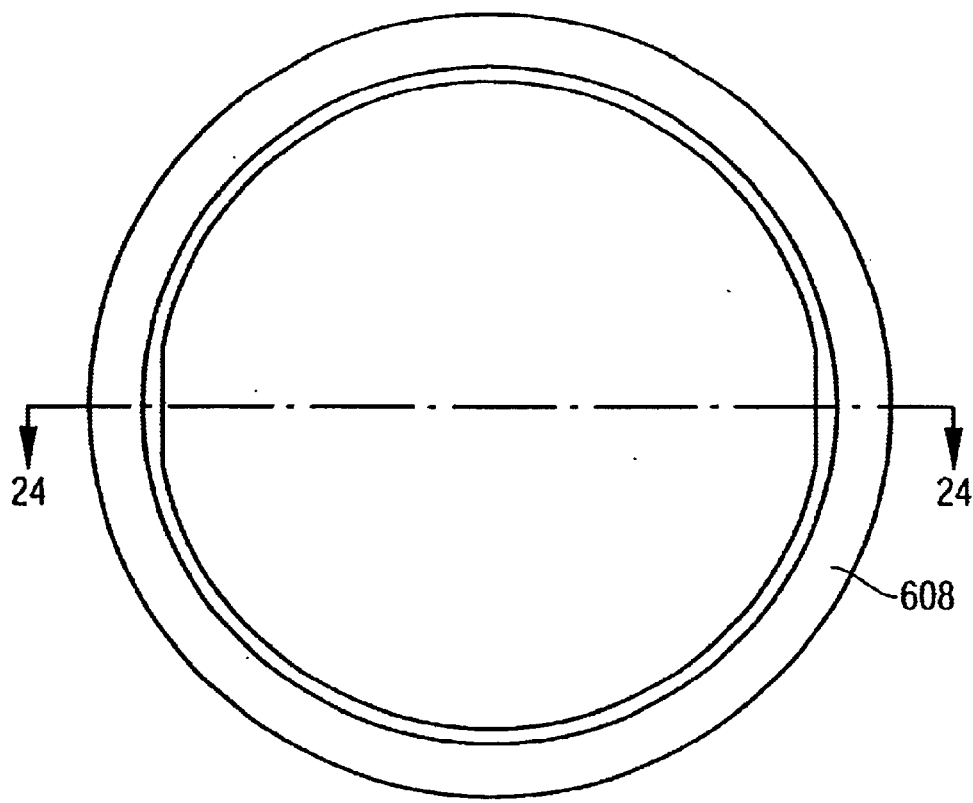
FIG. 23 shows a bottom view of an embodiment of a top silicon piece used with the focusing correction device of FIG. 18 in accordance with the present invention.
Figure 24:
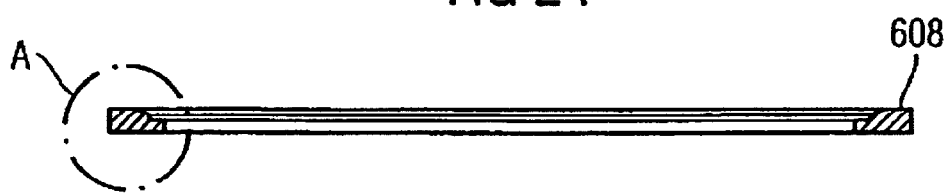
FIG. 24 shows a side cross-sectional view of the top silicon piece of FIG. 23 taken along line 24—24 of FIG. 23.
Figure 25:
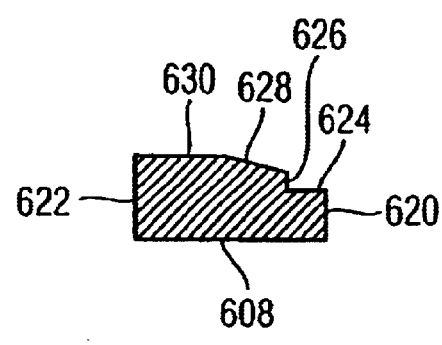
FIG. 25 shows an enlarged portion A of the side cross-sectional view of FIG. 24.

As shown in FIG. 18, the top piece 608 is supported upon the top face 612 of the bottom piece 610. The top piece 608 has an inner face 620 that is parallel with and abuts the dielectric layer 616 and has an outer face 622 that is parallel with and abuts the inner face of the top quartz piece 605. As shown in FIGS. 23–25, the silicon top piece 608 has a minimum inner diameter of approximately 7.725 inches. The top piece 608 has a total width of approximately 0.588 inches and has a maximum height of approximately 0.285 inches. The top piece 608 defines five interior surfaces: 1) the inner face 620 has a height of approximately 0.157 inches, 2) the surface 624 is parallel to the surface 612 and has a width of approximately 0.117 inches, 3) the surface 626 has a vertical height of approximately 0.062 inches and is angled outward by approximately 10° from vertical, 4) the surface 628 has a vertical height of approximately 0.066 inches and is angled outward by approximately 22° from vertical and 5) the surface 630 is parallel to surface 612 and has a width of approximately 0.296 inches.

The above described structure of the focusing correction device of FIGS. 18–25 is Rf coupled to the electrostatic chuck 603 in order to eliminate perpendicular incidence of ions at the surface near the edge at the wafer 208. As shown in FIG. 18, an Rf current is established in the electrostatic chuck 603 and the intermediate material 602 such that two Rf coupling points 652 and 654 are established. Coupling point 652 is located at the bottom of the intermediate material 602 nearest the lowest step of the electrostatic chuck 603. Coupling point 654 is established near the boundary between pieces 608 and 610. The end result of the coupling is that this Rf current flows from the electrostatic chuck 603 to the bottom of the piece 610 and subsequently to the top piece 608. Such current, establishes an electric field that corrects the tilt angle of the trajectory of ions striking the edge of the wafer 208. Thus, the Rf coupling effectively extends the effective diameter of the electrostatic chuck 603. Correction of the shapes of the electrical isopotential surfaces above the wafer 208 is accomplished primarily by altering the Rf field and coupling mentioned above. Note that such Rf coupling determines that the intermediate material 602 has the shape as described above. In addition, such Rf coupling is in contrast to the focusing correction devices of FIGS. 13–17 where the silicon pieces are at a floating potential. The above described correction focusing device of FIGS. 18–25 provides improved alignment.

Figure 26:
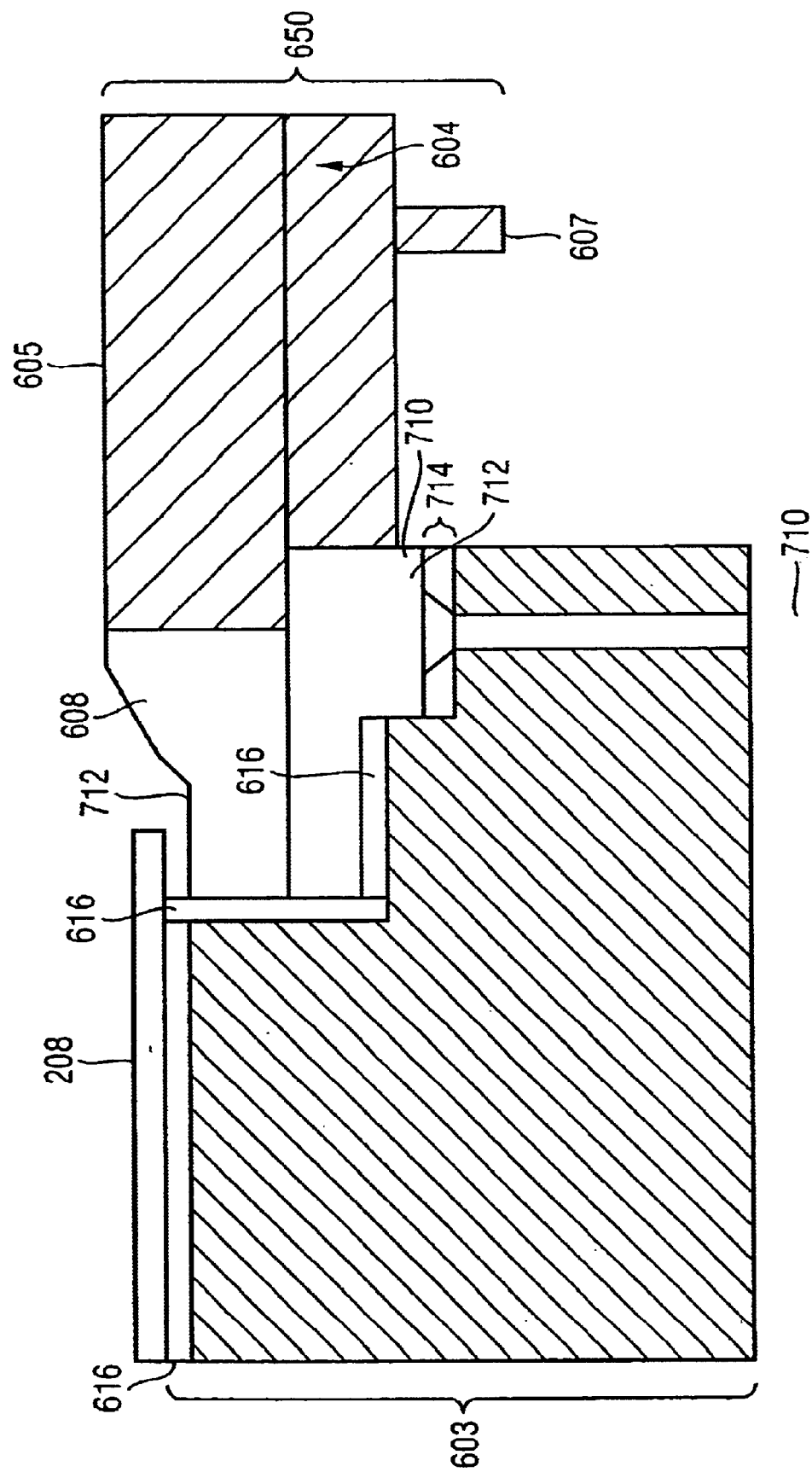
FIG. 26 shows a fourth embodiment of a focusing correction device in accordance with the present invention.

An alternative embodiment of the correction focusing device of FIGS. 18–25 is shown in FIG. 26 wherein like elements employ like numerals. In particular, an annular-like ring 700 made of a metal, such as aluminum, is sandwiched between the bottom face of the bottom piece 710 of the intermediate material 712 and the top face of the lowest step of the electrostatic chuck 603. The ring 700 has a thickness denoted by 714 in FIG. 26. (Note that bottom piece 710 and intermediate material 712 only differ from bottom piece 610 and material 602 of FIG. 18 due to the insertion of ring 700. In addition, the height of part 610 is preferably adjusted accordingly in order to maintain a secure fit between the lower and upper silicon rings 608, 610 and the quartz 650 in the chamber). The ring 700 is attached to the electrostatic chuck 603 via one or more screws 716, which are made of a durable conductive material such as stainless steel. Note that the head 718 of each screw 716 may be placed in a recess formed in the ring 700. Rf coupling is applied in a manner similar to that described above with respect to the embodiment of FIGS. 18–25. The ring 700 and the one or more screws 716 aid coupling and/or coupling repeatability by creating a direct connection to the cathode. The use of the ring 700 and the screw(s) 716 in conjunction with the Rf coupling to the electrostatic chuck 603 eliminates any potential coupling issues due to anodization. The correction focusing device of FIG. 26 provides improved alignment as well.

Note that in each of the embodiments of the focusing correction devices shown in FIGS. 13–26, the resistivities/conductivities and the shapes of the materials of the devices can be varied so as to generate a desired tilt angle for the ions. In addition, the ionized gas generators and method of alignment discussed previously can be utilized or scaled to operate on wafers 208 having a range of sizes, such as wafers having diameters ranging from approximately 200 mm to approximately 300 mm.

In the alignment processes and focusing correction devices described above with respect to FIGS. 8 and 13–26, the misalignment between circuit patterns and/or components of overlying layers is corrected. Similar alignment processes and focusing correction devices can be applied and used to correct for misalignment between a reference marker formed on a reference layer and a circuit pattern and/or component of an overlying layer. In this case, the process described above with respect to FIG. 8 is altered to take into account when the reference layer is the rth layer of the N total layers formed on the wafer. In this case, the flow chart of FIG. 8 is altered so that the flow chart of FIG. 27 results in a process 800.

Figure 27:
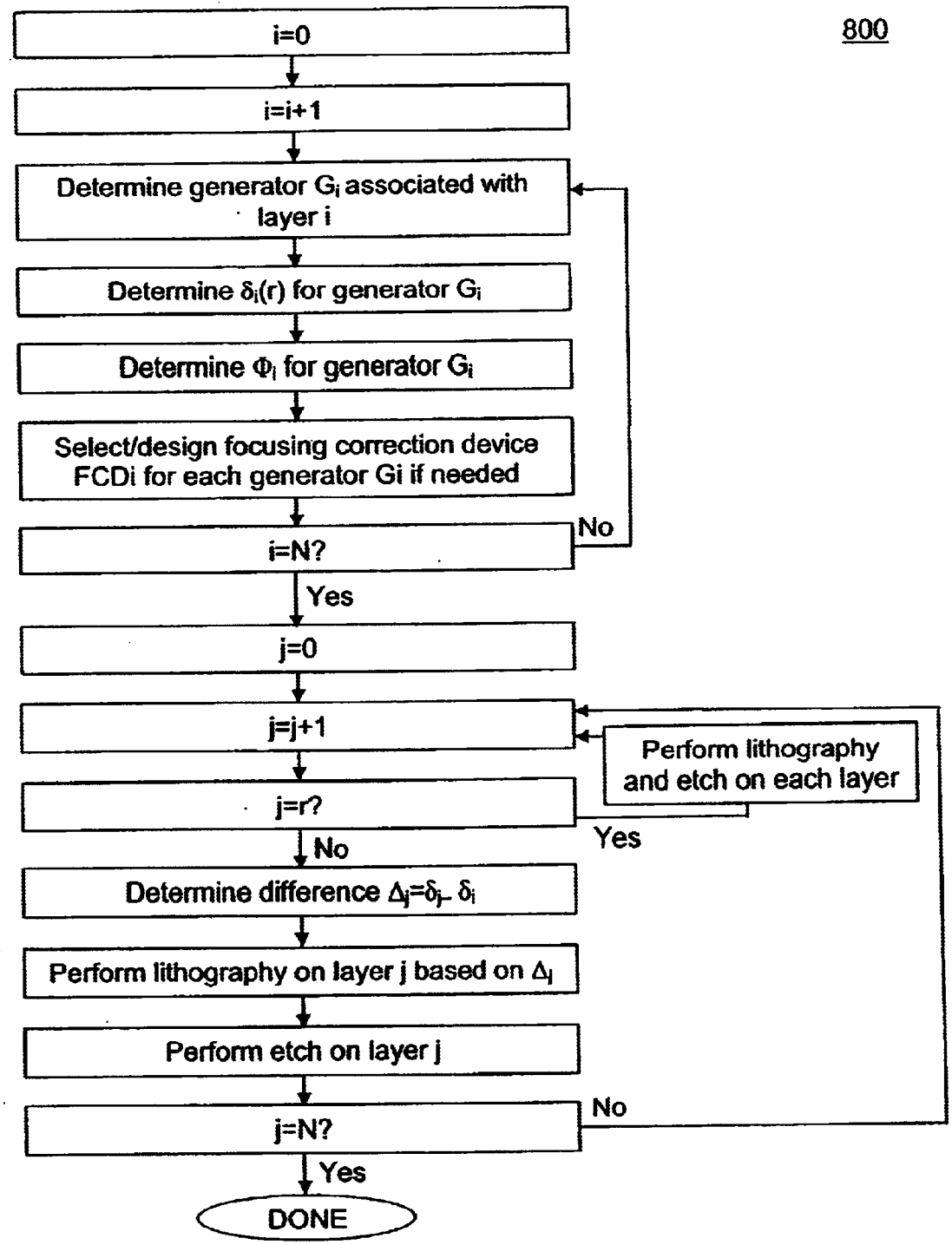
FIG. 27 shows a flows chart that illustrates an embodiment of a method of aligning a circuit pattern and/or a component formed on a layer with a reference layer of a wafer in accordance with the present invention.

Comparing the processes of FIGS. 8 and 27 reveals that they are similar in that each aligns a distinguished feature, such as a reference marker (FIG. 27) or an electrical circuit and/or component (FIG. 8), of one layer with an electrical circuit and/or component of another layer. The main difference between the processes of FIG. 8 and FIG. 27 is that the image displacement factor $\Delta_j = \delta_j(r) - \delta_r(r)$ for process 800 is between a layer j and the reference layer r. The image displacement factor is applied to the lithography process in the manner as mentioned previously with respect to step 314 of FIG. 8. In addition, focusing correction devices, similar to those shown in FIGS. 13–26, can be employed in the process 800 to match the isopotential surfaces outside the central area of the wafer for consecutive layers. Of course, the matching can be done so that all layers have an isopotential surface outside the central area that matches that of the rth layer.

The foregoing description is provided to illustrate the invention, and is not to be construed as a limitation. Numerous additions, substitutions and other changes can be made to the invention without departing from its scope as set forth in the appended claims.

We claim:

1. A method of aligning a second layer to a first layer of a semiconductor structure, the method comprising:

forming on a wafer a first layer comprising a distinguished feature via a first etching process that employs a first ionized gas generating machine that has a first pattern shift factor;

forming a second layer comprising a circuit pattern via a second etching process that employs a second ionized gas generating machine that has a second pattern shift factor, wherein said second etching process compensates for an image displacement factor that is the difference between said second pattern shift factor and said first pattern shift factor.

2. The method of claim 1, wherein said distinguished feature is a reference marker.

3. The method of claim 1, wherein said distinguished feature is a second circuit pattern.

4. The method of claim 1, wherein said first layer is formed directly on the wafer.

5. The method of claim 1, wherein said first layer is adjacent to said second layer.

6. The method of claim 1, wherein said image displacement factor is a radially symmetric function with respect to a central axis of the wafer upon which said first layer is formed.

7. The method of claim 6, wherein said image displacement factor is a constant.

8. The method of claim 6, wherein said image displacement factor is a linear function.

9. The method of claim 1, wherein said image displacement factor is a uniform function in an area of said wafer for said first layer that is exclusive of a peripheral area of said wafer.

10. The method of claim 1, wherein said forming a first layer comprises compensating for differences in shapes of electrical isopotential surfaces formed at an edge of said wafer for said first layer and at said edge of said wafer for said second layer.

11. A method of aligning a first layer to a second layer of a semiconductor structure, the method comprising:

forming a first layer of a wafer comprising a distinguished feature via a first etching process that employs a first ionized gas generating machine;

forming a second layer comprising a circuit pattern via a second etching process that employs a second ionized gas generating machine, wherein said forming said second layer comprises minimizing relative shifting between said distinguished feature located at an edge of said wafer for said first layer and said second circuit pattern located at said edge of said wafer for said second layer, based on the difference in a pattern shift factor between the first and the second ionizing gas generating machines.

12. The method of claim 11, wherein said distinguished feature is a reference marker.

13. The method of claim 11, wherein said distinguished feature is a second circuit pattern.

14. The method of claim 11, wherein said first layer is formed directly on said wafer.

15. The method of claim 11, wherein said first layer is adjacent to said second layer.

16. The method of claim 11, wherein said forming said second layer comprises compensating for differences in shapes of electrical isopotential surfaces formed at an edge of said wafer for said first layer and at an edge of said wafer for said second layer.

17. The method of claim 16, wherein said compensating comprises positioning a focusing correction device adjacent to an electrostatic chuck that supports said wafer.

18. The method of claim 16, wherein said compensating comprises applying an electric force adjacent to said edge of said wafer for said second layer.

19. The method of claim 17, wherein said compensating comprises applying an electric force adjacent to said edge of said wafer for said second layer.

20. The method of claim 11, wherein said minimizing comprises positioning a focusing correction device adjacent to an electrostatic chuck that supports said wafer.

21. The method of claim 11, wherein said minimizing comprises applying an electric force adjacent to said edge of said wafer for said second layer.

22. The method of claim 20, wherein said minimizing comprises applying an electric force adjacent to said edge said wafer for said second layer.

* * * * *